United States Patent
Iwaki

(10) Patent No.: US 7,691,758 B2
(45) Date of Patent: Apr. 6, 2010

(54) METHOD OF FORMING INSULATING FILM AND METHOD OF MANUFACTURING SEMICONDUCTOR DEVICE

(75) Inventor: Takayuki Iwaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/842,534

(22) Filed: Aug. 21, 2007

(65) Prior Publication Data
US 2008/0050930 A1    Feb. 28, 2008

(30) Foreign Application Priority Data
Aug. 22, 2006  (JP)  .............. 2006-225887

(51) Int. Cl.
*H01L 21/31* (2006.01)
*H01L 21/469* (2006.01)

(52) U.S. Cl. .............. 438/785; 438/608; 438/763; 257/E21.29; 257/E21.292

(58) Field of Classification Search .......... 438/785, 438/791, 608, 762, 763, 778, FOR. 385, FOR. 395; 257/E21.241, E21.29, E21.291, E21.292
See application file for complete search history.

(56) References Cited

U.S. PATENT DOCUMENTS

| | | | |
|---|---|---|---|
| 5,872,696 A * | 2/1999 | Peters et al. ............... 361/305 |
| 6,114,728 A * | 9/2000 | Yamazaki et al. ........... 257/347 |
| 6,555,161 B1 * | 4/2003 | Clough ....................... 427/217 |
| 2002/0075106 A1 * | 6/2002 | Okubora et al. ............. 333/247 |
| 2002/0119622 A1 * | 8/2002 | Steigerwald et al. ......... 438/244 |
| 2003/0001193 A1 * | 1/2003 | Park et al. ................... 257/310 |
| 2004/0043638 A1 * | 3/2004 | Nansei et al. ............... 438/792 |
| 2004/0183142 A1 * | 9/2004 | Matsuo et al. .............. 257/406 |
| 2005/0153571 A1 * | 7/2005 | Senzaki ...................... 438/778 |

FOREIGN PATENT DOCUMENTS

| CN | 1597587 | 3/2005 |
|---|---|---|
| JP | 08-293494 | 11/1996 |

OTHER PUBLICATIONS

Lin Huamao et al.; The Elements of Oxide Condition Which Influence the Electret Properties of the Thermally Wet-Grown SiO2 Films; Journal of Applied Sciences vol. 15, No. 2; Jun. 1997; pp. 143-148.

* cited by examiner

*Primary Examiner*—Matthew Smith
*Assistant Examiner*—Quovaunda Jefferson
(74) *Attorney, Agent, or Firm*—Young & Thompson

(57) ABSTRACT

A method of forming an insulating film according to one embodiment of the present invention, which is a method of forming an insulating film for use in a semiconductor device, performs thermal oxidation of a tantalum nitride film at a temperature range of 200 to 400 degrees centigrade by a wet oxidation process, whereby a tantalum oxide film is formed as the insulating film.

7 Claims, 4 Drawing Sheets

METHOD OF FORMING INSULATING FILM AND METHOD OF MANUFACTURING SEMICONDUCTOR DEVICE

This application is based on Japanese Patent application NO. 2006-225887, the content of which is incorporated hereinto by reference.

BACKGROUND

1. Technical Field

The present invention relates to a method of forming an insulating film for use in a semiconductor device, and a method of manufacturing a semiconductor device.

2. Related Art

A high dielectric constant film typified by oxidation tantalum (referred to as $Ta_2O_5$) is favorable as a material for a next generation gate oxide film in a dynamic random access memory (referred to as DRAM) or the like. In addition, it can be given that a metal insulator metal (referred to as MIM) decoupling capacitor is incorporated in a semiconductor chip as one of solutions for various problems that would arise with improvement of complementary metal oxide semiconductor (referred to as CMOS) devices. This can effectively eliminate a transient voltage for supplying the chip. In a 90 nm process and subsequent processes, effectiveness of an on-chip capacitor is growing from the viewpoint of effective frequency and instantaneous demand power.

The higher dielectric constant makes a capacitance insulating film for use in the MIM decoupling capacitor more useful. As a material with high dielectric constant, $Ta_2O_5$, $ZrO_2$, $HfO_2$, and the like can be used. Examples of typical manufacturing processes include a chemical vapor deposition (referred to as CVD) process, an atomic layer deposition (referred to as ALD) process, an $O_2$ plasma oxidation process, a dry $O_2$ thermal oxidation process, and the like. Above all processes, the dry $O_2$ thermal oxidation process has advantages in that its technique is simple and its device is comparatively inexpensive.

A known method of forming $Ta_2O_5$ is disclosed in Japanese Unexamined Patent Publication No. H08-293494, for example. The same document discloses that $TaN_{0.8}$ formed by a reactive direct current (referred to as DC) sputtering process or the CVD process is subjected to dry $O_2$ oxidation at a temperature range of 300 to 600 degrees centigrade to form $Ta_2O_5$.

In addition to Japanese Unexamined Patent Publication No. H08-293494, Japanese Unexamined Patent Publication No. H05-136342 can be given as an example of a conventional art document related to the present invention.

SUMMARY

However, the present inventor has recognized; in the aforementioned forming method, since the dry $O_2$ oxidation is performed at the temperature range of 300 to 600 degrees centigrade, a leak characteristic improves to some extent; however, there is a problem in that reaction rate is low. This leads to increase information time of a tantalum oxide film, and therefore, leads to increase in manufacturing time of a semiconductor device provided with the same.

In one embodiment, there is provided a method of forming an insulating film for use in a semiconductor device, including: performing thermal oxidation of a tantalum nitride film by a wet oxidation process at a temperature range of 200 to 400 degrees centigrade, whereby a tantalum oxide film is formed as the insulating film.

In this method, the tantalum nitride film is performed by wet thermal oxidation at the temperature range of 200 to 400 degrees centigrade to form the tantalum oxide film. This can sufficiently enhance its reaction rate in forming the tantalum oxide film at a comparatively low temperature using the tantalum nitride film, as to be described in detail later.

Furthermore, in another embodiment, there is provided a method of manufacturing a semiconductor device, including: forming the tantalum oxide film using the above method of forming an insulating film.

According to the present invention, there can be implemented a method of forming an insulating film and a method of manufacturing a semiconductor device, both of which being capable of obtaining a tantalum oxide film within a short time.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
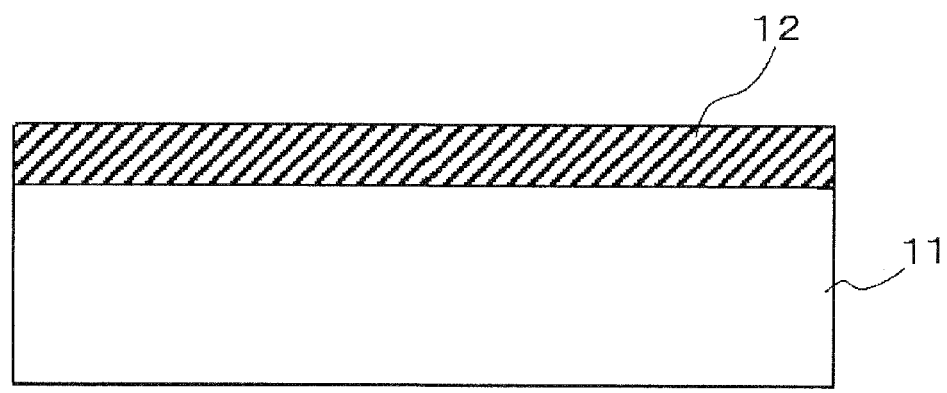
FIG. 1 is a process view showing a method of manufacturing a semiconductor device according to one embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A preferred embodiment of a method of forming an insulating film and a method of manufacturing a semiconductor device according to the present invention will be described in detail below with reference to the drawings. In addition, in the description of the drawings, the same elements are designated by the same reference numerals, and their description will not be repeated.

Figure 2:
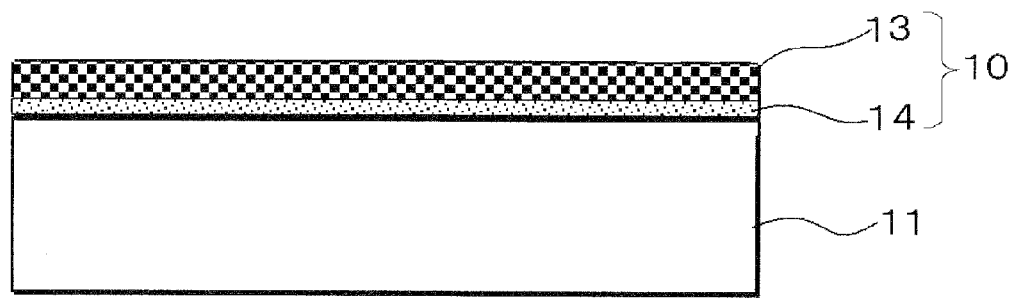
FIG. 2 is a process view showing the method of manufacturing the semiconductor device according to one embodiment of the present invention.
Figure 3:
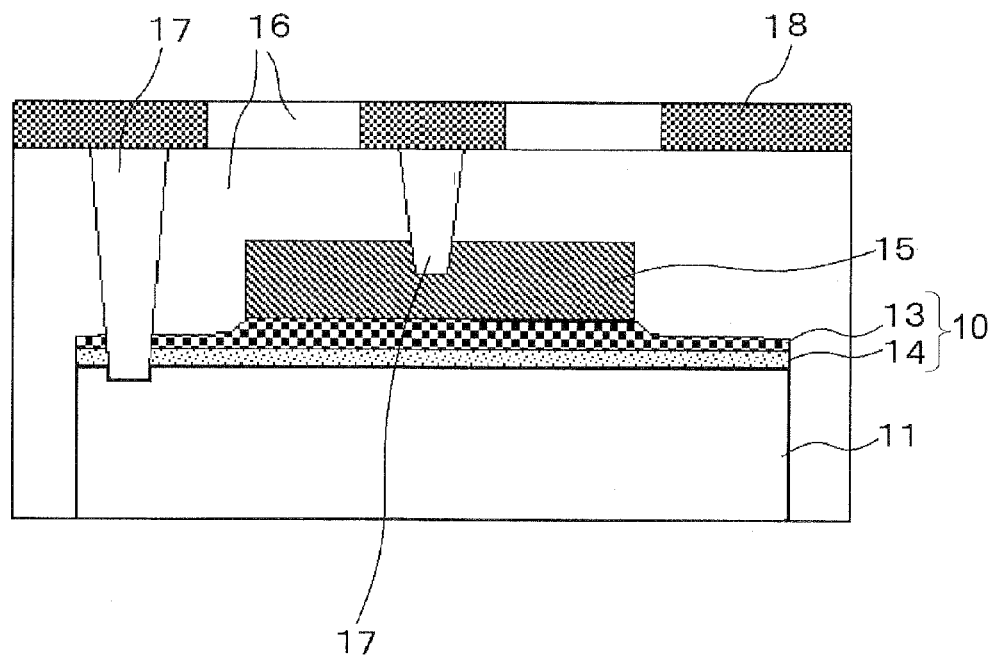
FIG. 3 is a process view showing the method of manufacturing the semiconductor device according to one embodiment of the present invention.

The method of manufacturing a semiconductor device according to one embodiment of the present invention will be described with reference to FIG. 1 to FIG. 3. In the present embodiment, as an example, there is manufactured a semiconductor device provided with an MIM capacitor which has a tantalum oxide film as a capacitance insulating film. In forming the above tantalum oxide film, the method of forming an insulating film according to one embodiment of the present invention is used.

First, a lower electrode 11 made of conductive metal nitride material such as titanium nitride is deposited using a sputtering process, a CVD process, or the like; and, a tantalum nitride (TaN) film 12 is deposited thereon using the sputtering process, the CVD process, or the like. The thicknesses of the lower electrode 11 and the tantalum nitride film 12 are, for example, 150 nm and 20 nm, respectively (FIG. 2).

Next, the surface of the tantalum nitride film 12 is oxidized at a temperature range of 200 to 400 degrees centigrade using a furnace in a moisture containing oxygen atmosphere where the humidity can be measured. A technique of oxidizing in such the moisture containing atmosphere where the humidity is measured is called as wet thermal oxidation. In this regard, however, the oxidation may be performed in the air atmosphere (room air). At this time, all of the deposited tantalum nitride film 12 is oxidized; however, a tantalum component may be remained. A tantalum oxide film 10 obtained therefrom has a laminated structure composed of a tantalum suboxide film 14 (first film) having nonstoichiometric composition and an amorphous $Ta_2O_5$ film 13 (second film) having stoichiometric composition. That is, a tantalum oxide material having a stoichiometric and amorphous property of $Ta_2O_5$ is formed in the vicinity of the surface, and tantalum suboxide having nonstoichiometric composition is thinly formed on the lower electrode 11 side (FIG. 2).

Next, an upper electrode 15 made of metal or conductive metal nitride material is formed on the tantalum oxide film 10. After that, the conductive films formed on and under the tantalum oxide film 10 (the upper electrode 15 and the lower electrode 11) are performed by dry etching using different patterns. Subsequently, the entire surface is deposited with a silicon oxide film 16; and then, the entire surface is planarized by chemical mechanical polishing (referred to as CMP). Further, a through hole 17 is formed by dry etching, and a conductive material made of tungsten (W), aluminum (Al), copper (Cu), or the like is embedded in the through hole.

Next, an interconnect 18 is formed so as to connect to the through hole 17. As a material of the interconnect 18, the above conductive material can be used. For example, in the case where the interconnect 18 is a copper interconnect, a trench for interconnect is formed by dry etching after depositing the silicon oxide film 16; copper is embedded in the trench by copper plating; and then, the interconnect 18 can be formed by performing CMP. A semiconductor device shown in FIG. 3 can be obtained by the above processes. In addition, although not shown in FIGS. 1 to 3, a structure shown in each drawing is practically formed on the semiconductor substrate such as a silicon substrate.

In the semiconductor device, the MIM capacitor is composed of the lower electrode 11, the tantalum oxide film 10, and the upper electrode 15; and when different potentials are applied to the lower electrode 11 and the upper electrode 15, the tantalum oxide film 10 is operated as a capacitance insulating film. In addition, in the semiconductor device, the above MIM capacitor is used as a decoupling capacitor, for example.

Effects of the present embodiment will be described. In the present embodiment, the tantalum nitride film is performed by wet thermal oxidation at the temperature range of 200 to 400 degrees centigrade to form the tantalum oxide film. The reason why such temperature range is set will be described. First, the upper limit needs to be set to not higher than 500 degrees centigrade in order to maintain an amorphous property of the tantalum oxide film 10. Further, the temperature range needs to be complied with specified temperatures of advanced large scale integrated circuit (referred to as LSI) process conditions. In view of the case that the above MIM capacitor is formed on a Cu interconnect as well as a transistor, a Cu agglomeration phenomenon and a formation temperature of NiSi of a CMOS gate electrode have to be considered. Based on this perspective, the upper limit of the temperature range needs to be set to not higher than 400 degrees centigrade.

Next, the lower limit will be described. There is a report that Ta is performed by dry thermal oxidation at the range of 100 to 700 degrees centigrade. In the range of less than 500 degrees centigrade, Ta is amorphous and has small influence of the crystal grain boundary, and its reaction rate can be expressed in natural logarithm. The dry thermal oxidation at 300 degrees centigrade is reported from the experiment conducted at the Illinois University in the following reaction rate equation:

$$\text{Thickness (nm)} = 4.7923 \times \ln(t+1) \tag{1}$$

where, t is reaction time (minute).

When the tantalum oxide film of 15 nm is obtained by performing the dry oxidation process at this temperature, it takes 21.9 minutes. If wet oxidation is performed, it is considered to be capable of forming within a shorter time than that time. In the case where T=150 degrees centigrade is assumed and the coefficient is simply reduced by half, it take 524 minutes when the tantalum oxide film of 15 nm is obtained similarly. It is possible to perform oxidation even at 150 degrees centigrade; however, reaction time becomes impractical as described above. Consequently, the lower limit of the temperature range is set to 200 degrees centigrade.

According to the present invention, the wet oxidation is performed at the temperature range of 200 to 400 degrees centigrade set by the above reason, whereby its reaction rate can be sufficiently enhanced in forming the tantalum oxide film at a comparatively low temperature using the tantalum nitride film.

In addition, the wet oxidation process described in the present embodiment has the same advantage as the aforementioned dry $O_2$ thermal oxidation process, that is, the wet oxidation process has advantages in that its technique is simple, and its device is comparatively inexpensive. In addition to this, the wet oxidation process has advantages in that a tantalum oxide film with an amorphous property having an excellent leak characteristic can be formed at low cost and with high efficiency.

When the wet oxidation process is performed in the air atmosphere, a furnace to be used is simpler in management than dry $O_2$ conditions. In addition, since it is not required to prepare an $O_2$ compressed gas cylinder, a further cost reduction can be achieved.

By the way, there is concern that oxidation reaction rate of tantalum remarkably degrades according to a decrease in temperature for making amorphous. It is particularly important to have countermeasures against oxidation of a tantalum nitride material whose oxidation rate is slow even at high temperature. Consequently, in the present embodiment, oxidation is performed in a moisture containing atmosphere where the humidity is measured as the countermeasures. This can improve the reaction rate not lower than 1.5 times (although depending on conditions).

Figure 4:
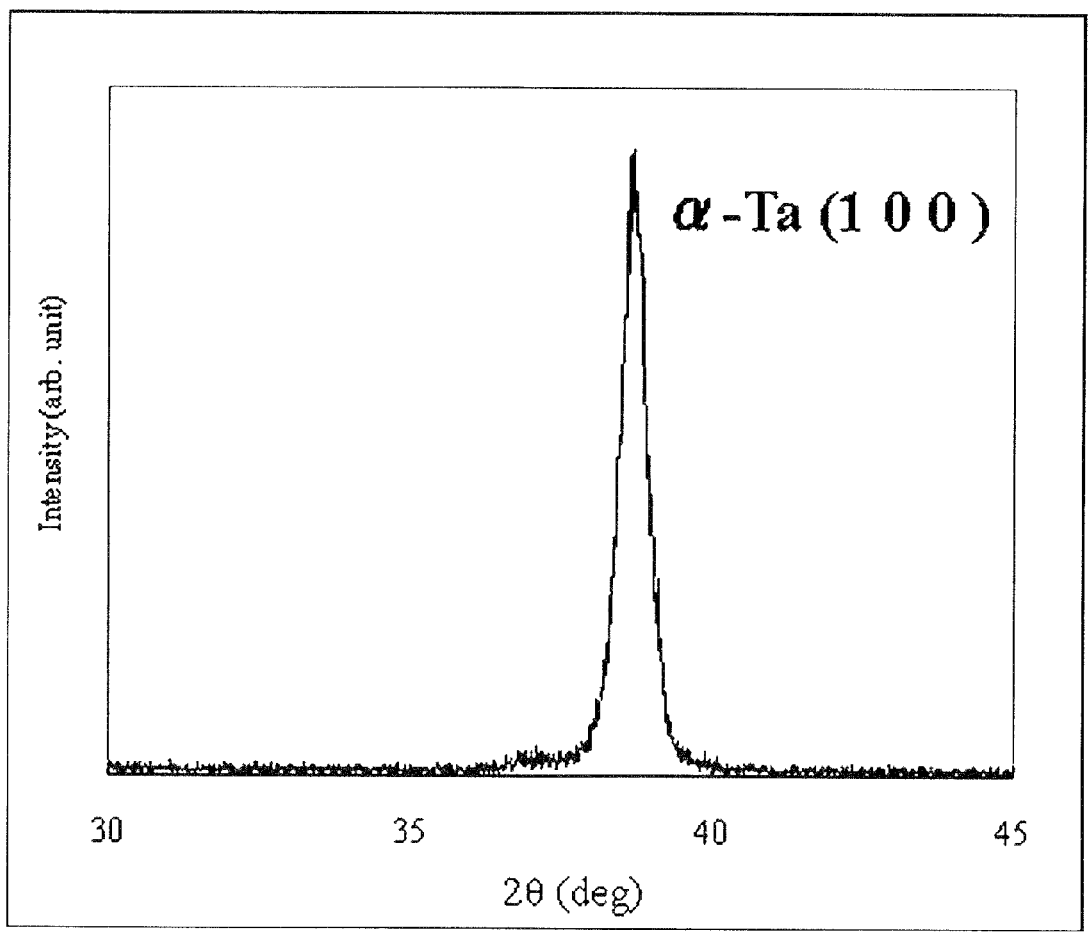
FIG. 4 is a graph showing a scattered spectrum obtained by XRD, being measured on a tantalum film which is formed on titanium nitride.

Further, forming of a tantalum film on the conductive metal nitride material is also one of the countermeasures against the degradation in oxidation reaction rate of the tantalum. In the case where the tantalum film is formed on the conductive metal nitride material by the sputtering process or the CVD process, its crystalline structure is more likely to become α-tantalum (body-centered cubic (referred to as bcc)). Meanwhile, for example, in the case where the tantalum film is formed on the silicon oxide film, β-tantalum (tetragonal) is more preferentially formed. It is known that α-tantalum is higher in oxidation efficiency than β-tantalum. That is, the tantalum formed on the conductive metal nitride material is smaller in resistance to oxidation than tantalum formed on other materials, and can be described as tantalum which is most suitable for surface oxidation. As an example, a scattered spectrum obtained by X-ray diffraction (referred to as XRD), measured about the tantalum film formed on titanium nitride (conductive metal nitride material) is shown in FIG. 4. The tantalum film indicates α-tantalum.

The method of forming an insulating film and the method of manufacturing a semiconductor device according to the present invention are not limited to the above embodiment; but, various modifications are possible. For example, the method of forming an insulating film according to the present invention is not limited to a capacitance insulating film, but, the method can be applicable to various insulating films for use in semiconductor devices. For example, the method may be applied to a gate insulating film.

It is apparent that the present invention is not limited to the above embodiment, and may be modified and changed without departing from the scope and spirit of the invention.

What is claimed is:

1. A method of forming an insulating film for use in a semiconductor device, comprising:
   depositing a conductive metal nitride material;
   depositing a tantalum nitride film on said conductive metal nitride material; and
   performing thermal oxidation of said tantalum nitride film by a wet oxidation process at a temperature range of 200 to 400 degrees centigrade, whereby a tantalum oxide film is formed as said insulating film, said tantalum oxide film has an amorphous structure,
   wherein all of the deposited tantalum nitride is oxidized, and
   wherein said tantalum oxide film has a laminated structure composed of a first film having nonstoichiometric composition and a second film having stoichiometric composition.

2. The method of forming an insulating film according to claim 1,
   wherein said thermal oxidation is performed in the air atmosphere.

3. The method of forming an insulating film according to claim 1, further comprising:
   performing surface oxidation of said tantalum nitride film, whereby said amorphous structure is obtained.

4. The method of forming an insulating film according to claim 1,
   wherein said first and second films are a tantalum suboxide film and an amorphous $Ta_2O_5$ film, respectively.

5. The method of forming an insulating film according to claim 1,
   wherein said tantalum oxide film is used as a capacitance insulating film in said semiconductor device.

6. A method of manufacturing a semiconductor device, comprising:
   forming said tantalum oxide film using the method of forming an insulating film according to claim 1.

7. The method of forming an insulating film according to claim 1, wherein said conductive metal nitride material is titanium nitride.

* * * * *